United States Patent [19]
Kato et al.

[11] Patent Number: 5,636,158
[45] Date of Patent: Jun. 3, 1997

[54] IRREGULAR PITCH LAYOUT FOR A SEMICONDUCTOR MEMORY DEVICE

[75] Inventors: Daisuke Kato, Poughkeepsie; Yohji Watanabe, Fishkill, both of N.Y.

[73] Assignee: Kabushiki Kaisha Toshiba, Kawasaki, Japan

[21] Appl. No.: 402,379

[22] Filed: Mar. 13, 1995

[51] Int. Cl.$^6$ .................................................. G11C 5/06
[52] U.S. Cl. ........................... 365/63; 365/51; 365/205
[58] Field of Search ................................. 365/205, 149, 365/51, 63; 257/390

[56] References Cited

U.S. PATENT DOCUMENTS

| | | | |
|---|---|---|---|
| 4,476,547 | 10/1984 | Miyasaka | 365/205 |
| 4,581,720 | 4/1986 | Takemae et al. | 365/222 |
| 4,586,171 | 4/1986 | Fujishima | 365/205 |
| 4,615,021 | 9/1986 | Yoshida et al. | 365/189 |
| 4,694,428 | 9/1987 | Matsumura et al. | 365/189 |
| 4,800,525 | 1/1989 | Shah et al. | 365/72 |
| 4,903,344 | 2/1990 | Inoue | 365/51 |
| 4,941,031 | 7/1990 | Kumagai et al. | 365/149 X |
| 4,980,864 | 12/1990 | Fukuhama et al. | 365/149 X |
| 5,014,241 | 5/1991 | Asakura et al. | 365/51 |
| 5,058,058 | 10/1991 | Yasuda et al. | 365/51 |
| 5,194,752 | 3/1993 | Kumagai et al. | 257/390 |
| 5,214,600 | 5/1993 | Cho et al. | 365/51 |
| 5,227,996 | 7/1993 | Uchida | 365/72 |
| 5,243,558 | 9/1993 | Saeki et al. | 365/182 |
| 5,365,474 | 11/1994 | Motonami | 365/51 |

OTHER PUBLICATIONS

"Circuit Techniques For a Wide Word I/O Path 64 Meg DRAM," Komatsuzaki, et al., *1991 Symposium on VLSL Circuits, Digest of Technical Papers*, pp. 133–134, Jun. 1991.

"A 30–ns 256–Mb DRAM with a Multidivided Array Structure," Sugibayashi, et al., *IEEE Journal of Solid–State Circuits*, vol. 28, No. 11, pp. 1092–1098, Nov. 1993.

"A 256M DRAM With Simplified Register Control For LWO PWOER Self Refresh and Rapid Burn–In," Yoo, et al., *Digest of Technical Papers, 1994 Symposium on VLSI Circuits*, pp. 85–86, Jun. 1994.

"A 0.6 μm$^2$ 256 Mb Trench DRAM Cell With Self–Aligned BuriED STrap (BEST)," Nesbit, et al., *IEDM Digest of Technical Papers*, pp. 627–630, Dec. 1993.

"A 40–ns 64–Mb DRAM with 64–b Parallel Data Bus Architecture," Taguchi, et al., *IEEE Journal Of Solid–State Circuits*, vol 26, No. 11, pp. 1493–1497, Nov. 1991.

*Primary Examiner*—David C. Nelms
*Assistant Examiner*—Huan Hoang
*Attorney, Agent, or Firm*—Banner & Witcoff, Ltd.

[57] ABSTRACT

A layout arrangement for a semiconductor memory device provides additional space for locating an additional circuit device in a pitch limited circuit. A space or vacated area is created by laying out a circuit element in a manner in which the pitch of the circuit element and an adjacent circuit element is less than the pitch of two times the pitch of a connecting wire pair in a double-sided layout or less than the pitch of one connecting wire pair.

16 Claims, 9 Drawing Sheets

FIG. 4
*PRIOR ART*

| (n∗x)μm | n∗(a) | n∗(b) | n∗(c) | n∗(d) | n∗(b) | n∗(a) |
|---|---|---|---|---|---|---|
| | n∗(a) | n∗(b) | n∗(c) | n∗(d) | n∗(b) | n∗(a) |
| | ⋮ | ⋮ | ⋮ | ⋮ | ⋮ | ⋮ |

| (m∗x)μm | n∗(a) | n∗(b) | n∗(c) | n∗(d) | n∗(b) | n∗(a) |
|---|---|---|---|---|---|---|
| | n∗(a) | n∗(b) | n∗(c) | n∗(d) | n∗(b) | n∗(a) |
| | | | | | | |
| | n∗(a) | n∗(b) | n∗(c) | n∗(d) | n∗(b) | n∗(a) |

| n∗(a) | n∗(b) | n∗(c) | n∗(d) | n∗(b) | n∗(a) |
|---|---|---|---|---|---|

16 Mb UNIT

N-S/A    COL SW    P-S/A    EQ/MUX

MDQ SW

P-S/A DRIVER

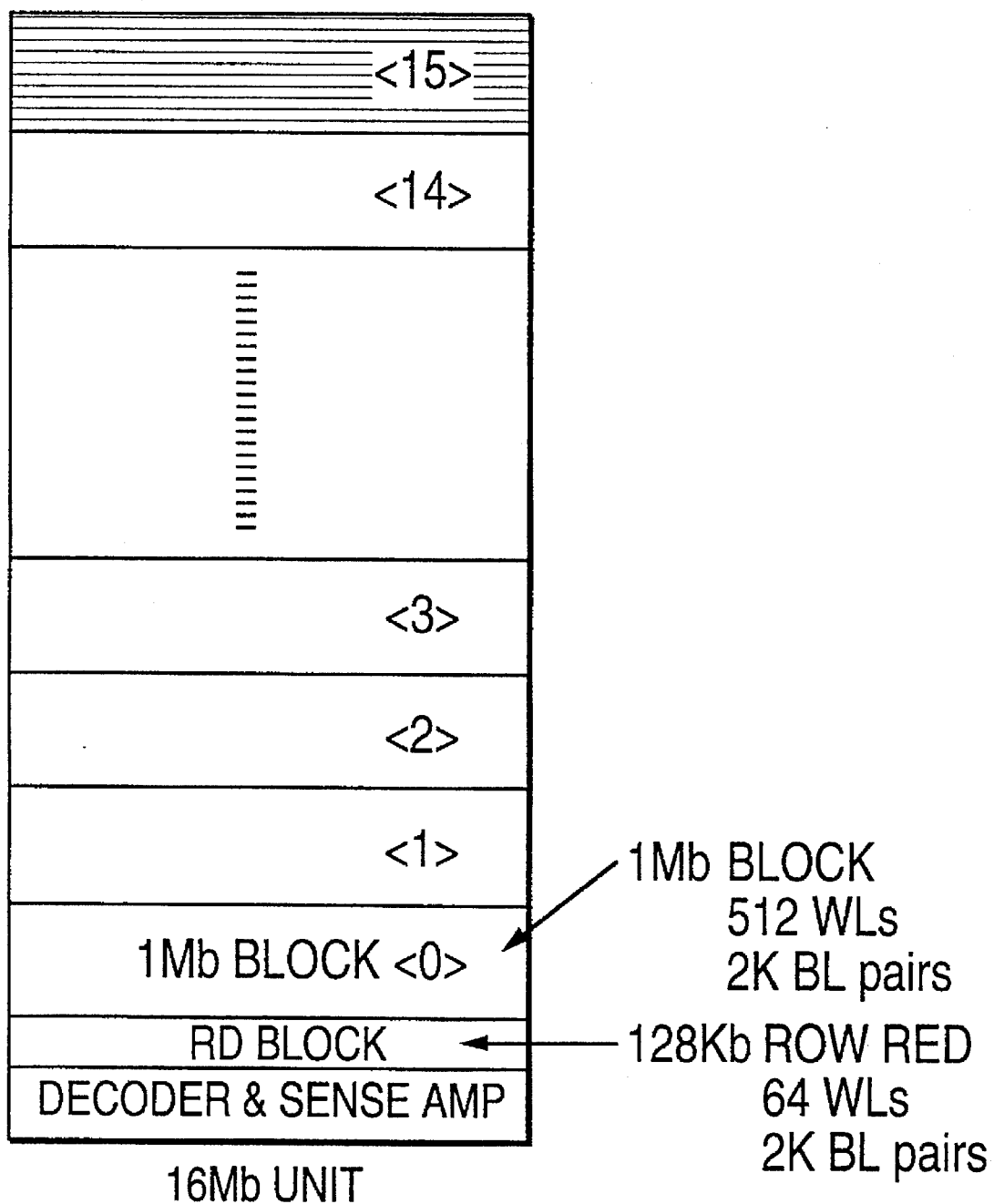

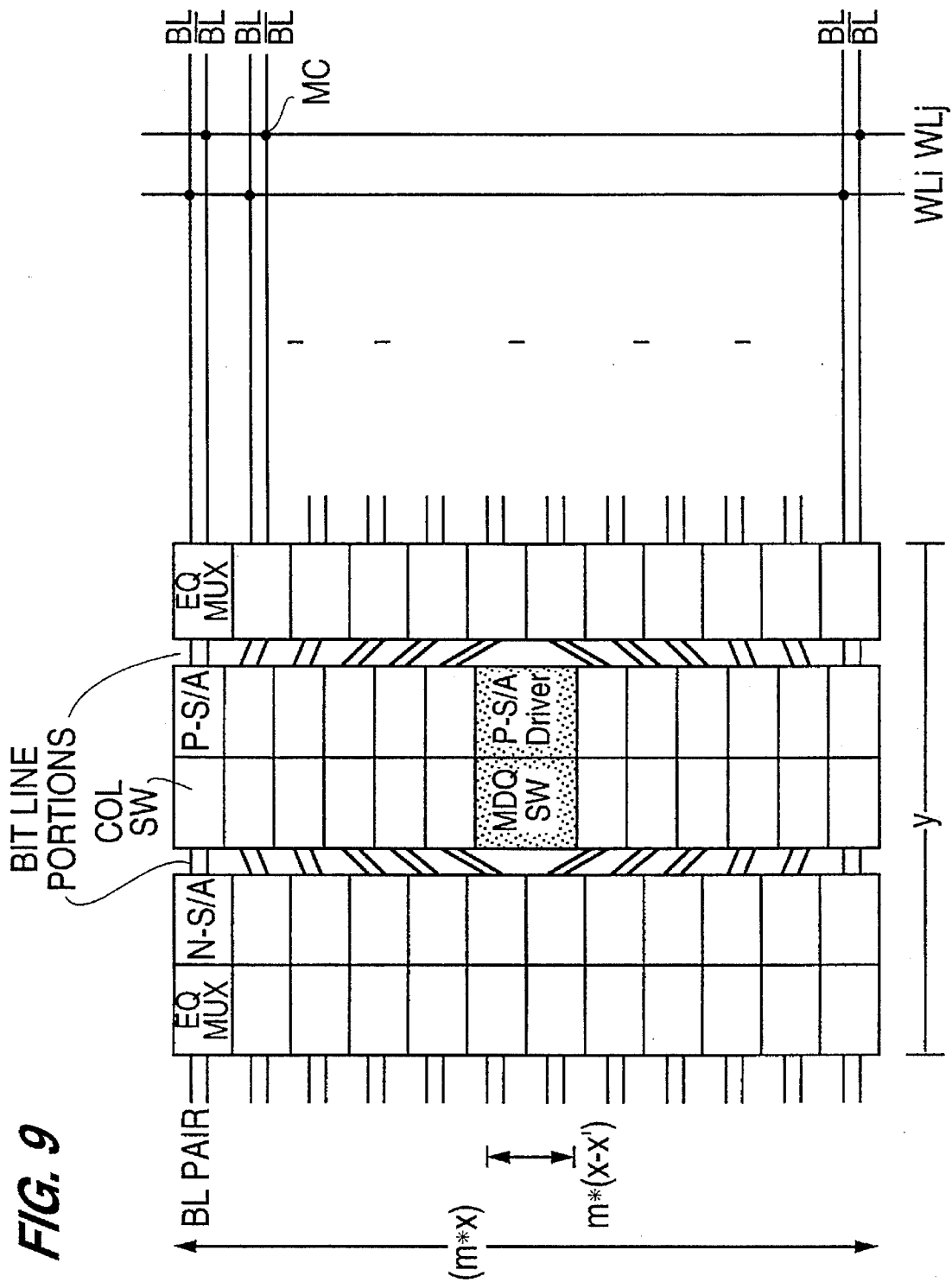

FIG. 10a
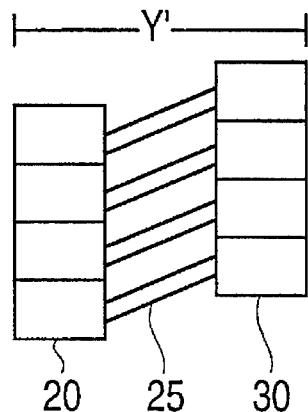
FIG. 10b
*PRIOR ART*
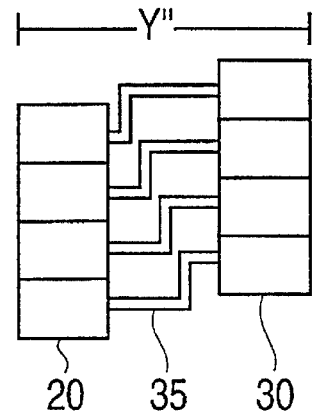
FIG. 12
|  CONVENTIONAL | NEW ARCHITECTURE |
|---|---|
| MEMORY CELL WIDTH 9.08 mm | MEMORY CELL WIDTH 9.08 mm |
| SENSE AMPLIFIER WIDTH 2.32 mm | SENSE AMPLIFIER WIDTH 1.91 mm |
| OTHER ELEMENTS WIDTH 2.26 mm | OTHER ELEMENTS WIDTH 2.26 mm |
| 13.66 mm (ESTIMATED) | 13.25 mm (DESIGNED) |

IRREGULAR PITCH LAYOUT FOR A SEMICONDUCTOR MEMORY DEVICE

FIELD OF INVENTION

The invention generally relates to a semiconductor memory device and, more particularly, to a DRAM having an irregular pitch layout.

BACKGROUND OF INVENTION

The growing market for high performance personal computers has created a demand for a new generation of dynamic random access memories (DRAMs) with wide bit organization. A wider I/O DRAM, greater than X16, is necessary to provide sufficiently small granularity for a memory system. Granularity is the minimum increment of memory that may be added to a system.

Hierarchical data-line architectures which transfer many bits over a memory array could potentially be used to provide a wide I/O. However, even using these schemes, chip size must be expanded to accommodate additional elements and wiring as I/O width increases.

The recent demand for higher density integration semiconductor memory devices has necessitated denser patterns of arrangement for bit lines, word lines, and sense amplifiers, etc. There are various known bit line layout configurations including open bit line structure shown in FIG. 1a and folded bit line structure shown in FIG. 1b. According to the open bit line structure as shown in FIG. 1a, the bit line pairs (B0, /B0), (B1, /B1), (B2, /B2), ... extend from both sides of the sense amplifiers and the column switches 1. The column switches 1 select the bit line pairs and connect the selected bit line pair to data lines (not shown). W0, W1, W2, ... are word lines. According to the folded bit line structure as shown in FIG. 1b, the bit line pairs (B0, /B0), (B1, /B1), (B2, /B2), ... extend in one direction in parallel away from the sense amplifiers 3 toward the column switches 5. Word lines are shown by W0, W1, W2, etc. In each bit line layout scheme, the arrangement of sense amplifiers is restricted by the space between the bit lines, i.e., the memory cell pitch. If a folded bit line structure is employed, the space between adjacent sense amplifiers cannot be relaxed in excess of two memory cell pitches. Further, conventional sense amplifiers are arranged one by one in the longitudinal direction of the bit lines in the spaces between the bit lines forming the memory cell array. Hence, it has been difficult to reduce the plane area of the region provided with the sense amplifiers.

To realize fast access time and a wide I/O operation, it is necessary to enhance the layout efficiency of chip architecture. If a wide data path were formed in the chip periphery, it would occupy extra area and result in an increased wiring capacitance due to the detour. To address this problem, local data lines (LDQs) assigned to the various bit line pairs are now being supplemented by master data lines (MDQs).

An example of an architecture including LDQs (LDQ, /LDQ) and MDQs (MDQ, /MDQ) is depicted in FIG. 2. This architecture type enables the MDQs to pass through cell arrays (i.e., the intersection of bit lines and word lines) and/or sense amplifiers S/A saving chip area versus when the data lines are formed on the chip periphery. However, it is necessary to find space to implement the block select switch transistors MDQSWs which connect the LDQs and the MDQs. A specific example of a 64 Mb DRAM architecture employing a segment data bus (i.e., LDQ) and a global data bus (MDQ) is described in "A 40-ns 64-Mb DRAM with 64-b Parallel Data Bus Architecture" by M. Taguchi et al. in *IEEE Journal of Solid State Circuits*, Vol. 26, No. 11, Nov. 1991, pp. 1493–1497.

In an exemplary design for a 256 Mb DRAM, equalizers, isolators/multiplexers, sense amplifiers and a DQ gate (bit switch), etc. are required elements for each bit-line pair. A sense amplifier region of the 256 Mb DRAM including the required elements is shown in FIG. 3 and more particularly described below. Each set of required elements must be laid out within a certain pitch that is determined by the pitch x of each bit line pair BL, /BL where the pitch x is measured in micrometers (μm). In other words, n sets of these elements are laid out within the width of (n*x) μm and form a single unit. Thereafter, a series of units are positioned repeatedly next to each other as shown in FIG. 4.

Only one master data line (MDQ) switch is necessary for a group of bit line pairs. Assuming that one MDQ switch is necessary for m pairs of bit lines, the MDQ switch is laid out within the width of (m*x) μm in a break area BA shown in FIG. 5a, or a word line stitch region SR in FIG. 5b.

According to the FIG. 5a arrangement, since only one MDQ switch is laid out in the break area, the area penalty is very large and the total length y of the unit block becomes larger.

In the FIG. 5b arrangement, the number and dimension of MDQ switches are determined by the number and area of the word line stitch regions SR, resulting in limited design. More specifically, the number of word line stitch regions is determined by considering the word line delay independent of the number of MDQ switches. Thus, if MDQ switches are laid out in word-line stitch regions, the total number of MDQ switches is limited since the word line stitch region is relatively narrow. The limited number of MDQ switches which can be implemented is not large enough to satisfy the needs for a wide I/O DRAM.

SUMMARY OF THE INVENTION

The present invention overcomes the limited design faults associated with conventional semiconductor devices. This is carried out by providing a layout which minimizes the area penalty caused by having to layout sparse devices such as MDQ switches and sense amplifier drivers in the semiconductor memory device.

BRIEF DESCRIPTION OF THE DRAWINGS

The present invention will now be described in more detail with reference to preferred embodiments of the invention, given only by way of example, and illustrated in the accompanying drawings in which:

FIG. 4 shows a layout scheme for a conventional DRAM device;

FIGS. 5a and 5b show layout schemes for a conventional DRAM device including space for an additional element;

FIG. 7 shows an exemplary 16 Mb unit of a 256 Mb DRAM chip;

FIG. 9 shows an illustrative irregular pitch circuit layout scheme according to the present invention;

FIGS. 10a and 10b show a circuit element layout according to the present invention and prior art, respectively.

FIG. 12 is a Table comparing the chip widths for an implementation of the present invention with that of a conventional chip.

DETAILED DESCRIPTION

The present invention is discussed below with reference to a 256 Mb DRAM device. However, the present invention may be applied to semiconductor memory devices having other memory sizes, particularly those devices which must accommodate additional elements and wiring.

Figure 6:
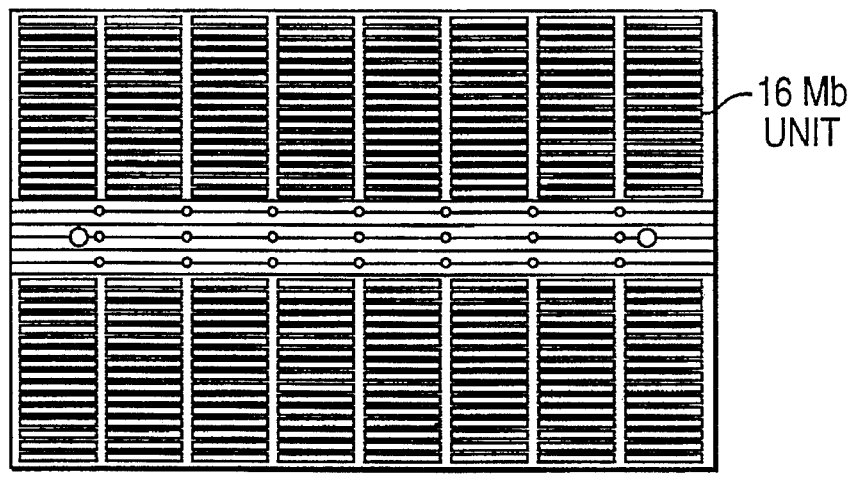
FIG. 6 depicts a microphotograph of an illustrative 256 Mb DRAM according to the present invention.
Figure 8:
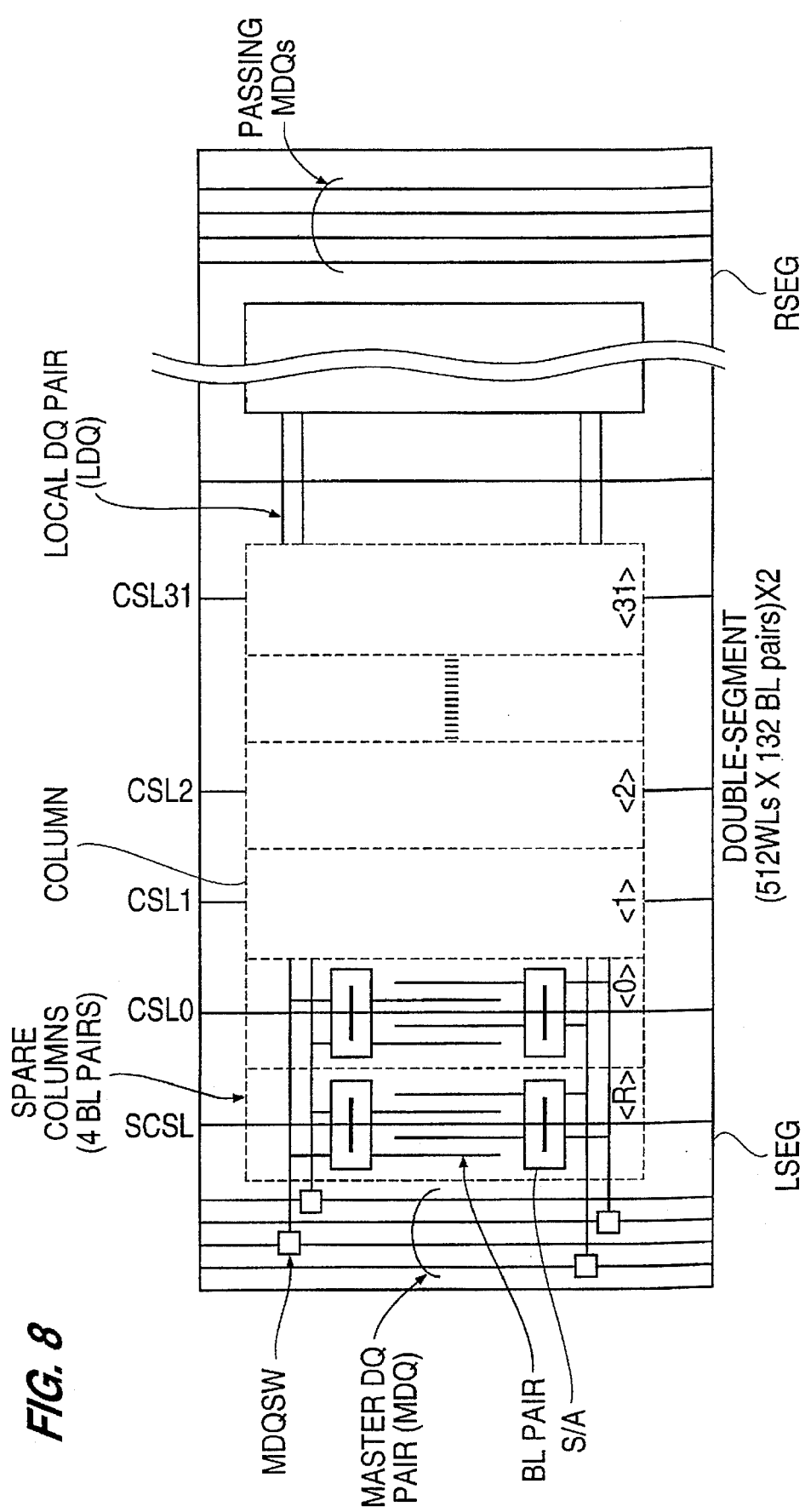
FIG. 8 shows an exemplary 128 Kb double segment of a 256 Mb DRAM chip.

An exemplary 256 Mb DRAM chip having X32 organization includes sixteen 16 Mb units with peripheral circuits and pads along the longer axis of the chip. A microphotograph of an illustrative 256 Mb DRAM is shown in FIG. 6. Each 16 Mb unit has sixteen 1 Mb blocks and a sense amplifier and row decoder with an optional 128 Kb row redundancy block as shown in FIG. 7. Each 1 Mb data block is divided into sixteen segments of 32 (or 33, if redundancy) columns composed of four bit line pairs. A double-segment including a left segment LSEG and a right segment RSEG of a 128 Kb (times 2) data block is shown in FIG. 8. Data from the four bit line pairs selected by a column selection signal CSL is transferred to the main sense amplifiers (not shown) through local data lines LDQ spanning segments LSEG and RSEG, master data line switches MDQSW, and master data lines MDQ. The MDQ lines are dedicated to either the upper half or the lower half of the 16 Mb unit so that two blocks can be activated simultaneously for 8K refresh mode (13 row addressing).

To minimize the number of sense amplifiers, an exchangeable hierarchical data line scheme is employed for the above-described 256 Mb DRAM device. This scheme is described in copending U.S. Patent Application entitled "Exchangeable Hierarchical Data Line Structure" by Yohji Watanabe and John Kenneth DeBrusse, U.S. patent application Ser. No. 08/403,265, which issued on Aug. 13, 1996 as U.S. Pat. No. 5,546,349, which was filed on the same day as the subject application and is herein incorporated by reference. This scheme allows sense amplifier sharing in the half unit boundary and complete coverage with only one redundancy block. The area increase due to extra elements and wiring is negligible.

Figure 1A:
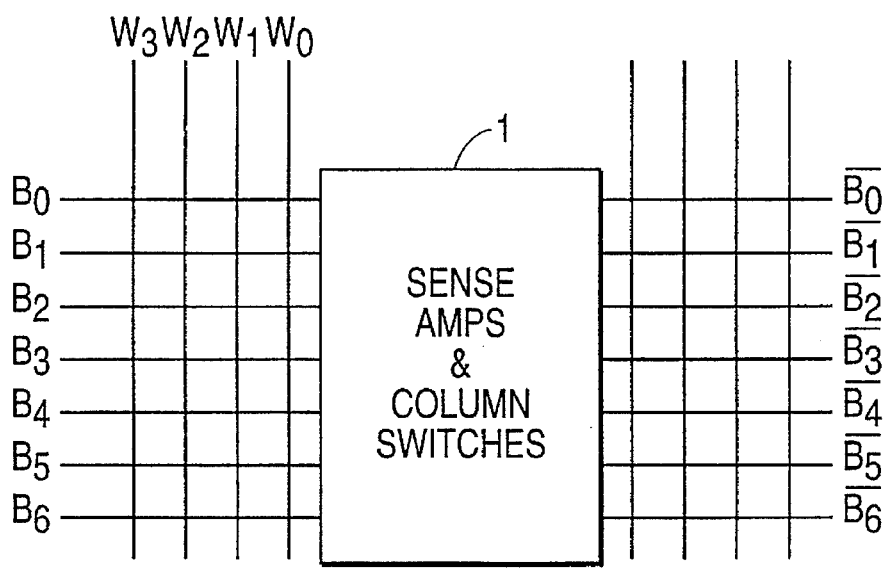
FIGS. 1a and 1b show conventional bit line architectures.
Figure 1B:
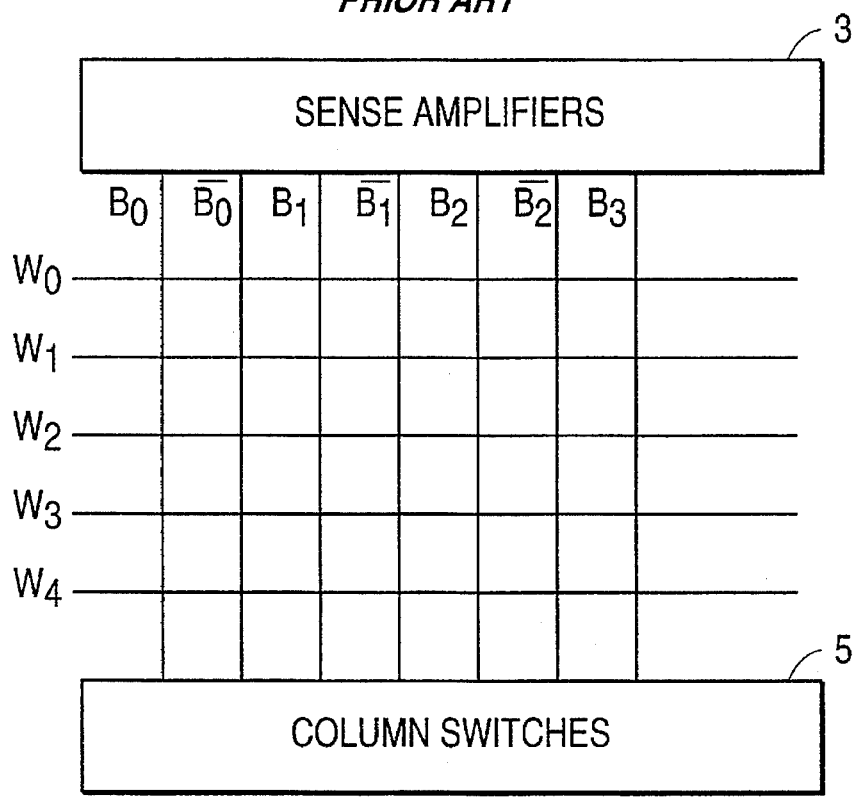
Figure 2:
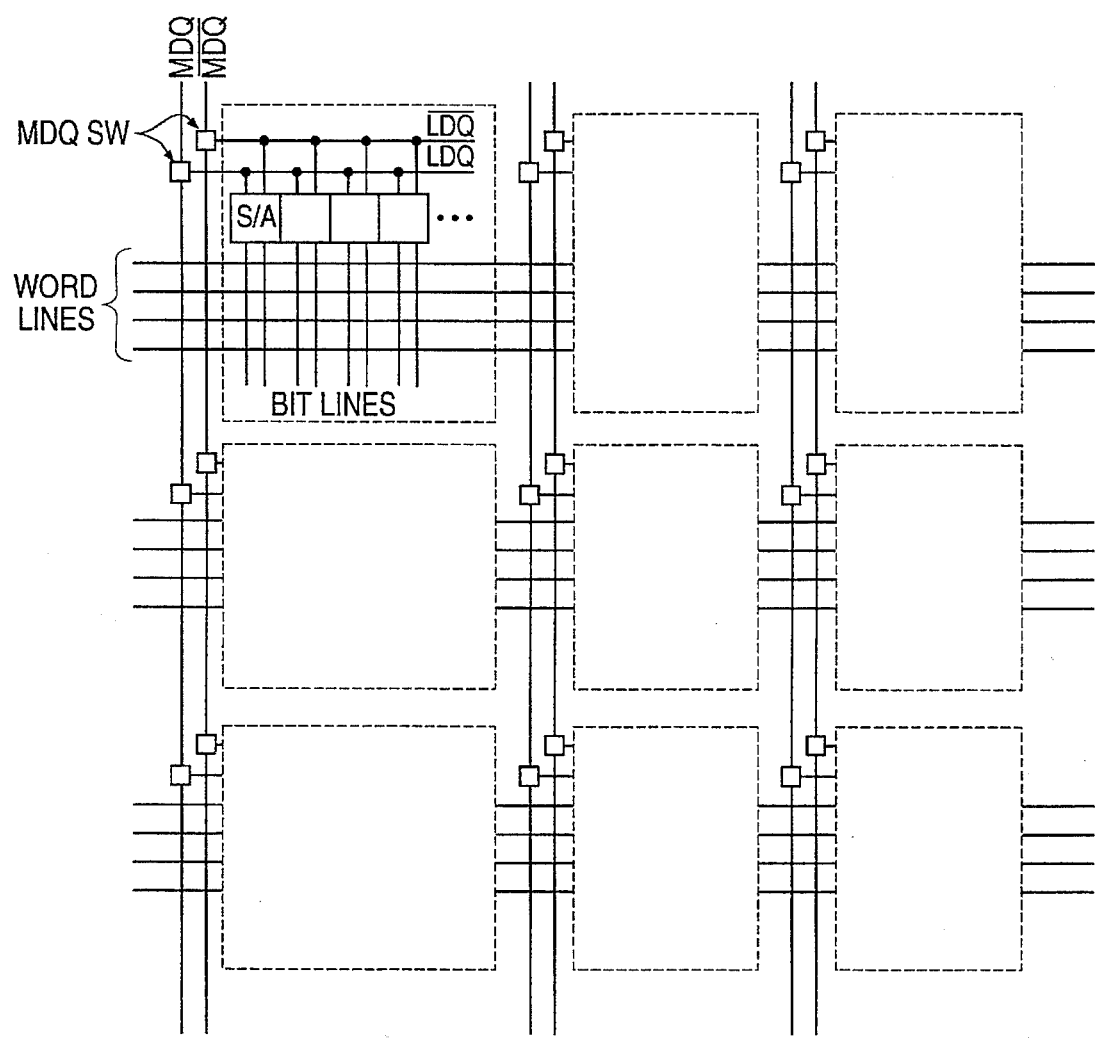
FIG. 2 shows an example of a DRAM including local data lines LDQ, master data lines MDQ, and master data line switches MDQSWs.
Figure 3:
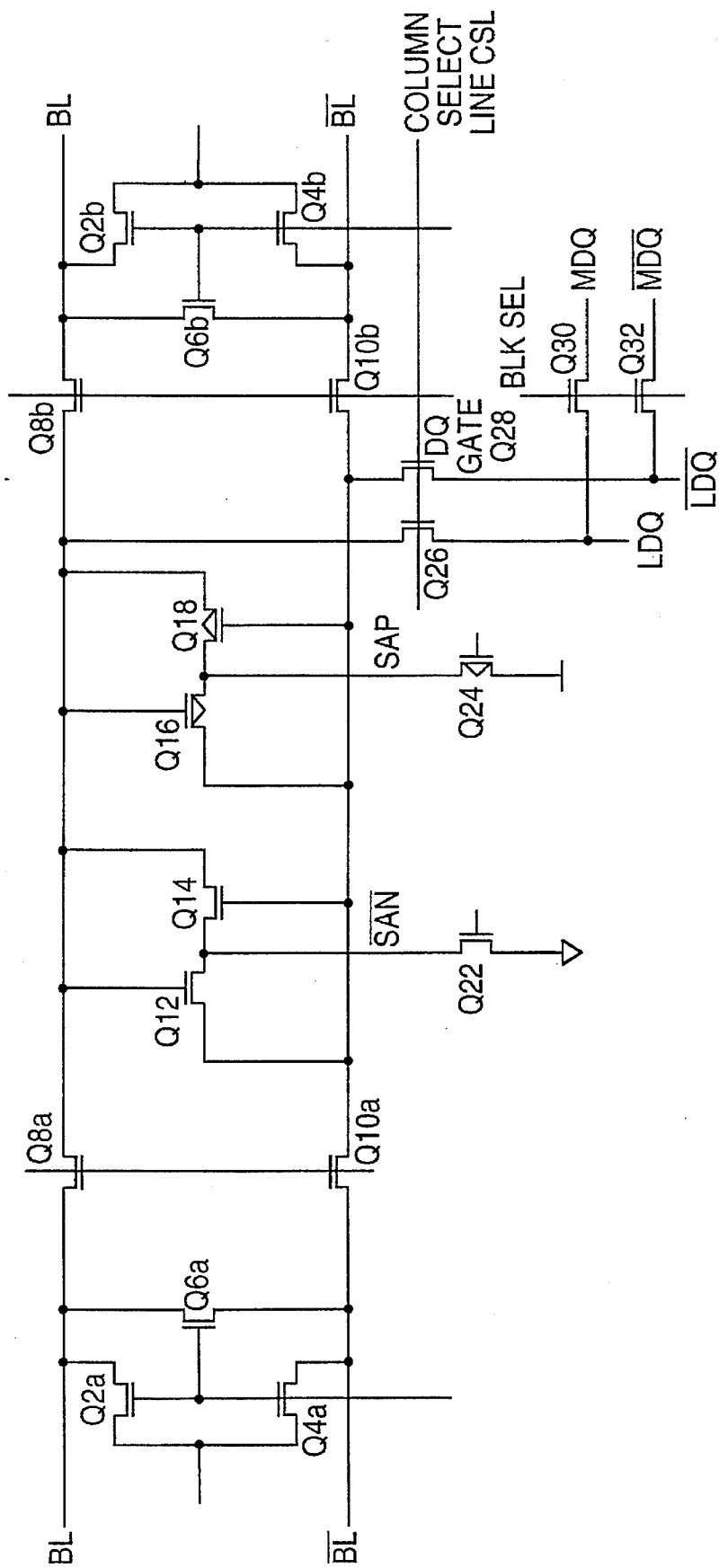
FIG. 3 shows an illustrative circuit diagram for a sense amplifier region of a 256 Mb DRAM.

Referring to the circuit diagram for a sense amplifier region of the exemplary 256 Mb DRAM device shown in FIG. 3 and described above, equalizers (NMOS transistors Q2a, Q4a, and Q6a; and Q2b, Q4b, and Q6b), isolators/ multiplexers (transistors Q8a and Q10a; and transistors Q8b and Q10b), NMOS sense amplifiers (transistors Q12 and Q14), PMOS sense amplifiers (Q16 and Q18) and a DQ gate i.e., bit switch, (transistors Q26 and Q28) etc. are required elements for each bit-line pair. The DQ gate receives the information on the bit lines BL and /BL and is triggered by the column select line CSL to output the data information onto the local data lines LDQ and /LDQ. Responsive to a block select signal BLK SEL, the MDQ switch (transistors Q30 and Q32) transfers the information to/from the MDQ data lines MDQ, /MDQ from/to the local data lines LDQ, /LDQ. The block select signal BLK SEL which connects the local data lines LDQs to the MDQ lines is activated corresponding to row addresses prior to activation of the CSL signal.

To form a single unit, n sets of the aforementioned required elements must be laid out within a certain pitch that is determined by the pitch x of each bit line pair BL, /BL, i.e., within the width of (n*x) μm. Thereafter, a series of units are positioned next to each other to efficiently allocate chip space.

Assuming there are m sets of the required elements depicted in FIG. 3 for each bit-line pair (or word-line, etc.), a layout for these elements according to the present invention is shown in FIG. 9. Each bit line BL, /BL is connected to a memory cell MC in a typical memory cell array arranged in rows and columns. The bit lines intersect a respective row word line (e.g., WLi, WLj) at each memory cell. The bit line pairs are connected to n or p type sense amplifiers, N-S/A and P-S/A, respectively via equalizer multiplexer circuitry EQ MUX. Bit line portion pairs (e.g., connecting wires) couple the sense amplifiers N-S/A to the column switches Col SW and couple the sense amplifiers P-S/A and the equalizer multiplexer circuitry EQ MUX. Selecting transistors in the form of column switches Col SW are coupled via the bit line portion pairs to the sense amplifiers for selecting a bit line pair to output data signals on the data lines, i.e., the LDQs.

The m sets of required elements are laid out within the width of (m*x') μm, where x' is smaller than the pitch of each bit line pair (or word lines, etc.). A space having a width of m*(x−x') μm is created and as shown in FIG. 9 contains MDQSW and P-S/A driver.

The pitch of the column switch Col SW and PMOS sense amplifier P-S/A is approximately 5% less than 4*BL pitch, i.e., 2*BL pair pitch for a double-sided reduced pitch circuit or 2*BL pitch, i.e., 1*BL pair for a single-sided reduced pitch circuit. A single-sided circuit arrangement, for example a single-sided sense amplifier is a row of sense amplifiers disposed on one side of a memory cell array. According to a double-sided arrangement, a cell array includes two sense amplifier rows, each disposed on different sides of the cell array. Bit lines are alternately connected to the first sense amplifier row and the second sense amplifier row in an interdigitated manner.

A sparse device, which refers to an element not necessary for each bit line pair (or word-line, etc.), may be laid out within the space or vacated area. For example, master data line switch circuitry (MDQSW) or sense amplifier driver circuitry (e.g., P-S/A Driver) can be placed in the vacated area adjacent to the sense amplifiers. The pitch reduction is small enough not to degrade the sensing margin. As a result, the area penalty on the chip is minimized and the total length y decreases. As shown in FIG. 9, the pitch of the bit line portion pairs varies from the pitch of the bit lines x up to a pitch of at least x+x'. In effect the bit line portion pairs, are progressively slanted to create a space in the middle of the bit line portion pairs area of the semiconductor chip. Further, the slanting results in a reduction of the total length y.

In particular, by reducing the pitch of a specific device to create space for a sparse device, the connecting wire between the specific device and the other devices should be slanted. How much the wire should be slanted depends on the reduction of the pitch i.e. x−x'. The wires that are slanted the most are those nearest the sparse device that is inserted. FIG. 10a shows an illustration of connecting circuitry elements with diagonal wires 25 and FIG. 10b shows a conventional layout where elements 20 and 30 are connected with orthogonal wires 35. Comparing FIGS. 10a and 10b, it can be seen that connecting circuitry elements with diagonal wires 25 reduces the layout size y' of FIG. 10a to be less than the layout size y" of connecting circuitry elements with orthogonal wires 35.

Figure 11:
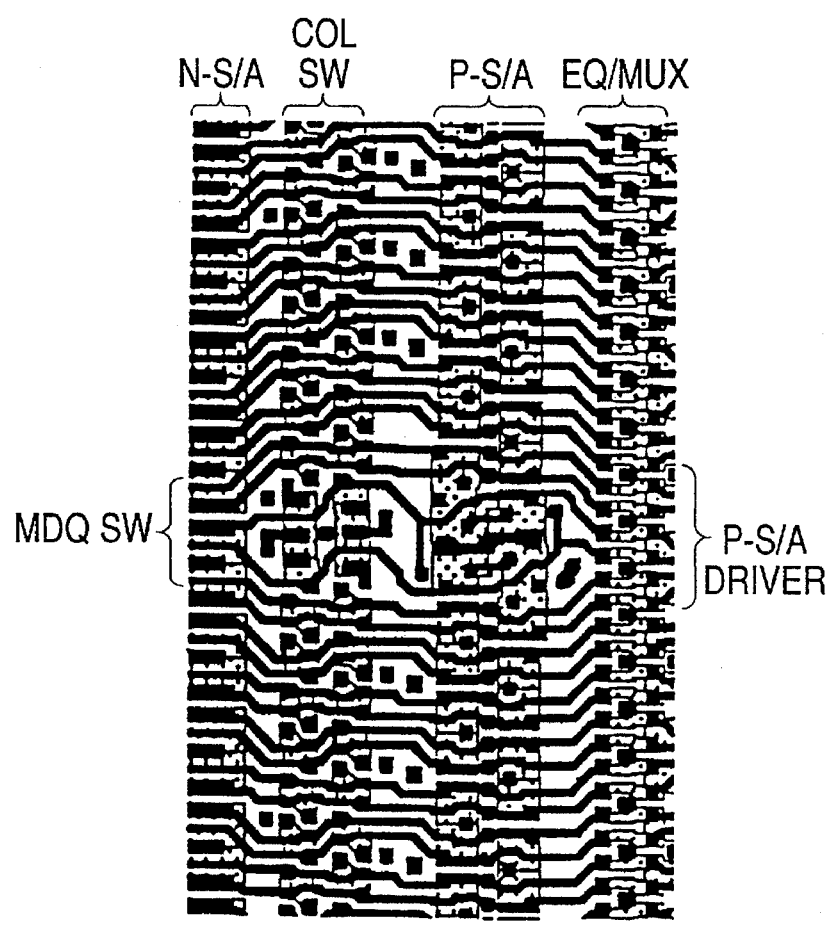
FIG. 11 shows a layout image of an illustrative sense amplifier configuration according to the present invention.

FIG. 11 shows a layout image of an illustrative sense amplifier configuration according to the present invention.

Elements requiring more space than available in prior art DRAM layout schemes can be laid out in the space provided by the present invention by minimizing the width of x'.

A 256 Mb DRAM with the above-described architecture has been developed and implemented using 0.25 μm CMOS technology with the BEST cell. The BEST cell is described in "A 0.6 μm² 256 Mb Trench DRAM Cell with Self-Aligned BuriEd STrap (BEST)" by Nesbit et al. in *IEDM Dig. Tech. Papers*, December 1993, pp. 627–630. The chip has an area of 13.25 mm by 21.55 mm (i.e., 286 mm²) which is the smallest DRAM ever reported despite the X32 organization. The total sense amplifier width was reduced 18% from 2.32 mm of a conventional DRAM to 1.91 mm by the combination of the exchangeable hierarchical data line scheme described in copending U.S. patent application Ser. No. 08/403,265, which issued on Aug. 13, 1996 as U.S. Pat. No. 5,546,349, and the sense amplifier layout of the present invention. Both the exchangeable data line scheme and the sense amplifier layout contribute a 9% width reduction to the total sense amplifier width. FIG. 12 is a Table comparing the chip widths of the aforementioned chip with a conventional chip. The size of the conventional DRAM is the estimated value when the exchangeable data line scheme and the sense amplifier layout of the present are not employed.

Although the above description applies to the layout of sense amplifiers, the present invention is directed to the implementation of sparse devices and applies to all types of pitch-limited circuit layouts including row decoders, word line drivers, column decoders, etc. Moreover, in the layout of sense amplifiers, although selecting transistors and p-channel sense amplifiers are laid out to have a pitch of less than two times a pitch of bit line pairs in the embodiment, the pitch of any of the n-channel sense amplifiers, equalizer, or multiplexer could be reduced to implement MDQ switches.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. A semiconductor memory device on a semiconductor chip comprising:

a memory cell array including memory cells arranged in rows and columns;

bit line pairs connected to said memory cells, each bit line pair consisting of first and second bit lines which are respectively connected to a memory cell in a corresponding one of said columns;

sense amplifiers coupled to said bit line pairs, each sense amplifier for sensing data on a respective one of said bit line pairs;

selecting transistors coupled to said bit line pairs for selecting a bit line pair to output complementary data signals onto data lines; and wherein said selecting transistors and said sense amplifiers are laid out on said semiconductor chip to have a pitch of less than two times a pitch of one of said bit line pairs in a double-sided circuit arrangement.

2. The semiconductor device according to claim 1 wherein the pitch of said selecting transistors and said sense amplifiers is approximately 5% less than two times the pitch of one of said bit line pairs in the double-sided circuit arrangement.

3. The semiconductor device according to claim 1 wherein said sense amplifiers are arranged into first and second groups, and wherein a space is created on said semiconductor chip between said first and second groups of sense amplifiers.

4. The semiconductor device according to claim 3 wherein a sparse device is placed in the space on said semiconductor chip.

5. The semiconductor device according to claim 4 wherein said sparse device includes one of a sense amplifier drive circuit, a data line switch circuit, and a sense amplifier drive circuit and a data line switch circuit.

6. The semiconductor device according to claim 1 further comprising bit line portion pairs for interconnecting said sense amplifiers with said selecting transistors or for coupling said sense amplifiers to said bit line pairs wherein a pitch of substantially all of said bit line portion pairs is greater than a pitch of one of said bit line pairs.

7. The semiconductor device according to claim 1 further comprising bit line portion pairs for interconnecting said sense amplifiers with said selecting transistors or for coupling said sense amplifiers to said bit line pairs wherein each of said bit line portion pairs is slanted.

8. A layout arrangement for a semiconductor device on a semiconductor chip comprising:

first line pairs consisting of first and second lines which are respectively connected to a memory cell in one of a corresponding row and corresponding column of a memory cell array;

sense amplifiers connected to said line pairs, each sense amplifier for sensing data on a respective one of said first line pairs;

selecting transistors coupled to said line pairs for selecting one of said line pairs to output complementary data signals; and wherein said selecting transistors and said sense amplifiers are laid out on said semiconductor chip to have a pitch less than a pitch of any of said first line pairs.

9. A layout arrangement for a semiconductor device comprising:

m line pairs, wherein m is an integer, each line pair having the same pitch x; and m sets of circuitry elements, each set corresponding to ones of said m line pairs, said m sets of circuitry elements being laid out within a width of m*x', x' being less than the pitch x; and a space having a width of m*(x–x').

10. The layout arrangement according to claim 9, wherein (x–x')/x is approximately 0.95.

11. The layout arrangement according to claim 9, wherein said line pairs are one of bit line pairs and word lines.

12. The layout arrangement according to claim 9, wherein said circuitry elements include m sense amplifiers and m selecting transistors.

13. The layout arrangement according to claim 9 further comprising at least one sparse device to fill at least a portion of said space.

14. The layout arrangement according to claim 13, wherein said at least one sparse device includes one of a sense amplifier drive circuit, a data line switch circuit, and a sense amplifier drive circuit and a data line switch circuit.

15. The layout arrangement according to claim 9 further comprising m connecting wire pairs, each connecting wire pair corresponding to a respective set of circuitry elements, for interconnecting the circuitry elements in said respective set, wherein a pitch of substantially all of said connecting wire pairs is greater than x and a pitch of one of said connecting wire pairs is greater than or equal to x+x'.

16. The layout arrangement according to claim 9 further comprising m connecting wires, each connecting wire corresponding to a respective set of circuitry elements, for interconnecting the circuitry elements in said respective set, wherein each of said connecting wires is slanted.

* * * * *